(12) United States Patent
Komori et al.

(10) Patent No.: US 7,238,992 B2
(45) Date of Patent: Jul. 3, 2007

(54) SEMICONDUCTOR CIRCUIT FOR DC-DC CONVERTER

(75) Inventors: Yuri Komori, Kanagawa (JP); Kazuo Mitsui, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 344 days.

(21) Appl. No.: 11/034,884

(22) Filed: Jan. 14, 2005

(65) Prior Publication Data
US 2005/0151525 A1 Jul. 14, 2005

(30) Foreign Application Priority Data
Jan. 14, 2004 (JP) .............................. 2004-006495

(51) Int. Cl.
*H01L 29/78* (2006.01)
*G05F 1/00* (2006.01)
*G05F 1/62* (2006.01)

(52) U.S. Cl. .................. 257/365; 323/282; 327/543; 257/E27.011

(58) Field of Classification Search ............ 323/282; 327/543; 257/365
See application file for complete search history.

(56) References Cited

U.S. PATENT DOCUMENTS
5,616,945 A * 4/1997 Williams .................... 257/365

FOREIGN PATENT DOCUMENTS
JP      2001-43690    2/2001

* cited by examiner

*Primary Examiner*—Evan Pert
(74) *Attorney, Agent, or Firm*—Young & Thompson

(57) ABSTRACT

In a semiconductor integrated circuit for a DC—DC converter, an nMOS-type transistor Qn of a CMOS inverter 1c constituting a driver 1 is electrically floated from a substrate 12 through an n-type well region 11. Thus, the nMOS-type transistor Qn is electrically insulated from other transistors such as an npn-type transistor Q1 and an L-pnp-type transistor Q2 constituting a feedback control system 9 through the n-type well region 11. Stable operation is performed with a minute current without producing a malfunction caused by the influence of a parasitic current, even if the drain potential of an nMOS-type transistor is reduced to the ground potential or lower at the time of switching by a driver constituted from a CMOS inverter, to facilitate lower power consumption and higher efficiency, and also to eliminate a constraint on layout design of components.

8 Claims, 9 Drawing Sheets

SEMICONDUCTOR CIRCUIT FOR DC-DC CONVERTER

FIELD OF THE INVENTION

The present invention relates to a semiconductor integrated circuit for a DC—DC (Direct Current to Direct Current) converter. More specifically, the invention relates to a semiconductor integrated circuit for a DC—DC converter in which a CMOS (Complementary Metal Oxide Semiconductor) inverter operated as a driver is formed on a semiconductor substrate thereof.

BACKGROUND OF THE INVENTION

As a direct current source used in electronic devices such as a cellar phone, a DC input DC output DC—DC converter, for example, is widely employed. A synchronous rectifying DC—DC converter of a step-down type hitherto known as a type of this DC—DC converter (which will be simply referred to as a DC—DC converter as well). The driver is constituted from a CMOS inverter for switching a power supply voltage (DC input voltage) Vcc. The filter circuit smoothes the output of the driver and outputs a preset desired DC voltage (set DC voltage), and a control circuit controls the CMOS inverter.

In the DC—DC converter of the configuration described above, other components except for the filter circuit are integrated into the circuit and manufactured as the semiconductor integrated circuit for the DC—DC converter.

In a semiconductor integrated circuit for the DC—DC converter, there is a problem that a parasitic transistor is created, so that the DC—DC converter malfunctions due to a parasitic current.

An example of a semiconductor integrated circuit for a negative step-up circuit used in nonvolatile semiconductor storage devices such as a flash EEPROM (Electrically Erasable and Programmable Read Only Memory) is disclosed in Patent Document 1, for example. The semiconductor integrated circuit serves to prevent creation of a parasitic NPN transistor, and as shown in FIG. 9, the semiconductor integrated circuit is configured using an NMOS-type transistor of a triple-well structure. A Deep-N-well 202 is formed on a P-type silicon wafer 201, a P-well 203 is formed on this Deep-N-well 202, and a Deep-N-well terminal 209 having a floating potential is formed over this Deep-N-well 202. An NMOS-type transistor M201 is formed over the P-well 203, and nodes N202 and N203 are also formed over the P-well 203. To the nodes N202 and N203, capacitances C201 and C202 are connected, respectively.

According to the semiconductor integrated circuit of the configuration as described above, the P-well 203 and the Deep-N-well 202 are separated. Thus, each of their potentials can be set to a specific potential or the floating potential. Thus, it is described that even if a parasitic NPN transistor Q201 is created, potentials of a base and a collector thereof become floating ones, so that even if a base current Ib flows from the P-well 203 to the node N202 due to a step-up operation, a constant collector current Ie is not generated, and the parasitic NPN transistor Q201 can be thereby made to be ineffective.

[Patent Document 1]
JP Patent Kokai Publication No. JP-P2001-43690A

SUMMARY OF THE INVENTION

The present invention has been made in view of the circumstances described above. It is therefore an object of the present invention to provide a semiconductor integrated circuit for a DC—DC converter that can be operated stably with a minute current, without producing a malfunction caused by the influence of a parasitic current even if the drain potential of an nMOS-type transistor therein is reduced to the ground potential or lower at the time of switching by a driver constituted from a CMOS inverter therein.

It is another object of the present invention to provide a semiconductor integrated circuit for a DC—DC converter of which lower power consumption and higher efficiency can be facilitated, and of which a constraint on layout design of components therein can be eliminated.

According to a first aspect of the present invention, there is provided a semiconductor integrated circuit for a DC—DC converter configured to switch a DC input voltage by a CMOS inverter therein, for outputting an output to an inductive load therein, and generate a control voltage responsive to an output voltage by a feedback control system therein to be fed back to the CMOS inverter, repeating the switching so as to finally obtain a desired DC output voltage, the semiconductor integrated circuit including transistors constituting the CMOS inverter and other transistors constituting the feedback control system, the transistors and the other transistors being integrated on a same semiconductor substrate therein. The first aspect of the present invention is characterized in that an nMOS-type transistor constituting one of the transistors constituting the CMOS inverter is formed on the semiconductor substrate through a semiconductor region electrically insulated from the other transistors constituting the feedback control system.

A second aspect relates to the semiconductor integrated circuit for the DC—DC converter according to the first aspect and is characterized in that the semiconductor region is an n-type well region.

A third aspect relates to the semiconductor integrated circuit for the DC—DC converter according to the second aspect, and is characterized in that the n-type well region is formed by same process steps as a region constituting at least one of the other transistors.

A fourth aspect relates to the semiconductor integrated circuit for the DC—DC converter according to the second or third aspect, and is characterized in that the n-type well region is connected to a stable potential.

A fifth aspect relates to the semiconductor integrated circuit for the DC—DC converter according to the fourth aspect, and is characterized in that the stable potential is the power supply potential or the ground potential.

A sixth aspect relates to the semiconductor integrated circuit for the DC—DC converter according to any one of the first through fifth aspects, and is characterized in that a timing adjustment circuit for constituting the final stage of the feedback control system and preventing a through current from flowing through the CMOS inverter is connected to the CMOS inverter.

A seventh aspect relates to the semiconductor integrated circuit for the DC—DC converter according to the sixth aspect, and is characterized in that the timing adjustment circuit sets a time for simultaneously switching off the nMOS-type transistor and a pMOS-type transistor constituting the CMOS inverter.

An eighth aspect relates to the semiconductor integrated circuit for the DC—DC converter according to any one of first through seventh aspects, and is characterized in that the DC—DC converter is constituted from a step-down type converter.

According to ninth aspect, instead of the nMOS-type transistor in the first aspect, a pMOS-type transistor is formed.

The meritorious effects of the present invention are summarized as follows.

According to a semiconductor integrated circuit for a DC—DC converter of the present invention, an nMOS-type transistor constituting one of a CMOS inverter operated as a driver is formed on a semiconductor substrate through a semiconductor region electrically insulated from other transistors constituting a feedback control system. Thus, even if the drain potential of the nMOS-type transistor is decreased to the ground potential or lower, a malfunction caused by the influence of a parasitic current will not occur, and a stable operation can be performed with a minute current. Further, lower power consumption and higher efficiency can be facilitated, and a constraint on layout design of components can be eliminated.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Before describing the present invention, the related art will be explained in detail with reference to FIG. 5 in order to facilitate the understanding of the present invention.

Figure 5:
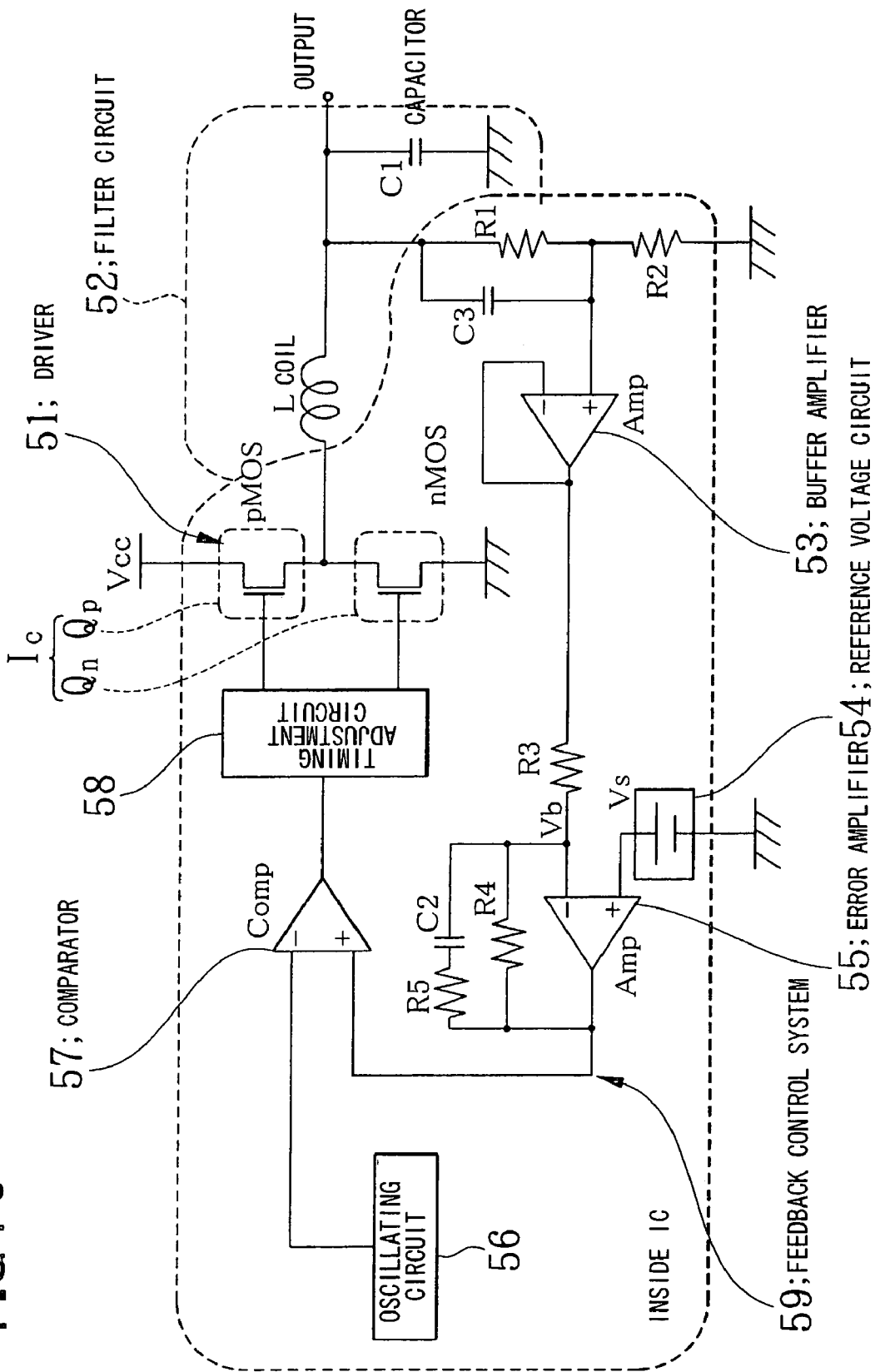
FIG. 5 is a diagram showing a basic circuit configuration of a semiconductor integrated circuit for a DC—DC converter according to a related art.

As shown in FIG. 5, the DC—DC converter is constituted from a driver (driver circuit) 51, a filter circuit 52, a buffer amplifier 53, an error amplifier 55, a comparator 57, and a timing adjustment circuit 58. The driver 51 is constituted from a CMOS inverter Ic for switching a power supply voltage (DC input voltage) Vcc, for output. The filter circuit 52 smoothes the output of the driver 51 and outputs a preset desired DC voltage (set DC voltage). The buffer amplifier 53 inputs the output of the filter circuit 52. The error amplifier 55 inputs an output Vs of a reference voltage circuit 54 constituted from a regulator or the like and an output Vb of the buffer amplifier 53, and amplifies a difference voltage between Vs and Vb. The comparator 57 inputs the output of the error amplifier 55 and the output of the oscillating circuit 56. The output of the comparator 57 is input to the timing adjustment circuit 58, and the outputs of the timing adjustment circuit 58 are connected to the gates of the driver 51. A reference character Qn denotes an nMOS-type transistor constituting one of the CMOS inverter Ic, Qp denotes a pMOS-type transistor constituting the other of the CMOS inverter IC, R1 to R5 denote resistances, C1 to C3 denote capacitors, L denotes a coil that becomes an inductive load, Vs denotes the output voltage of the reference voltage circuit 54, and Vb denotes the output voltage of the buffer amplifier 53.

Figure 6:
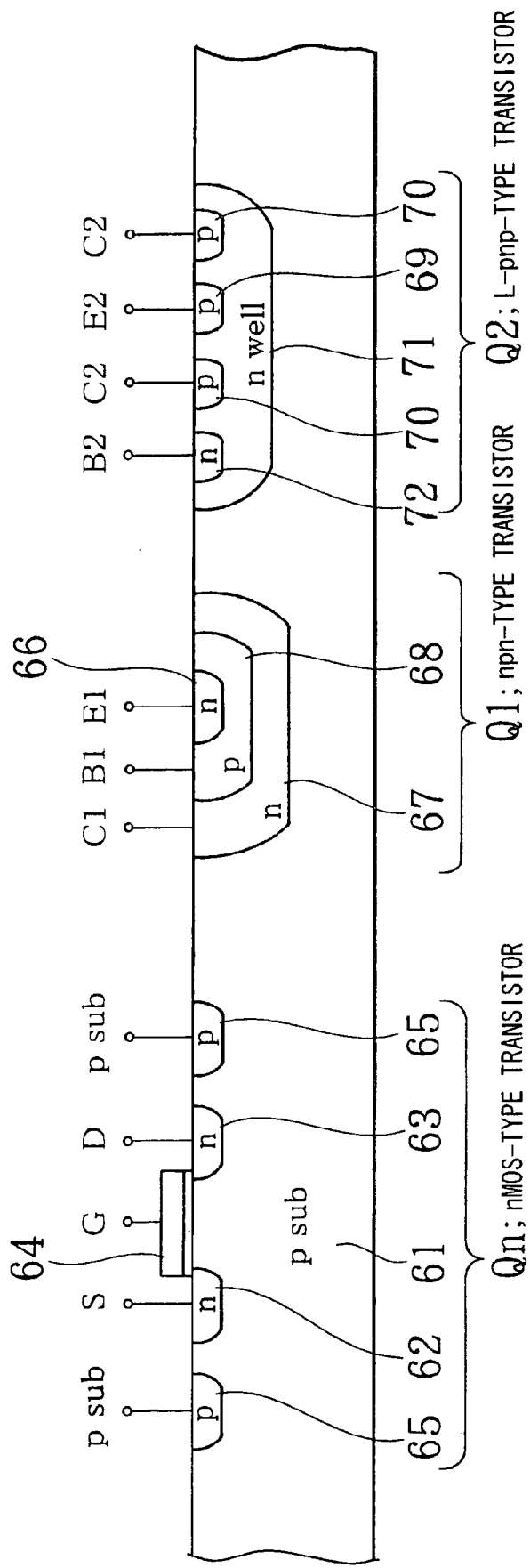
FIG. 6 is a sectional view showing a part of the semiconductor integrated circuit for the DC—DC converter according to a related art.

In the DC—DC converter of the configuration described above, other components except for the filter circuit 52 are integrated into the circuit and manufactured as the semiconductor integrated circuit for the DC—DC converter. FIG. 6 is a sectional view showing a part of the semiconductor integrated circuit for the DC—DC converter and shows an example where the nMOS-type transistor Qn constituting one of the CMOS inverter Ic as the driver 51 and other transistors such as an npn-type transistor Q1 and an L (Lateral)-pnp type transistor Q2 constituting the feedback control system 59 are integrated, being in close proximity to each other. A source terminal S and a drain terminal D are taken out from an n-type source region 62 and an n-type drain region 63 of the nMOS-type transistor Qn, respectively, a gate terminal G is taken out from an insulating gate section 64, and a substrate terminal p sub is taken out from a substrate 61 through a p-type contact region 65. Further, an emitter terminal E1 and a collector terminal C1 are taken out from an n-type emitter region 66 and an n-type collector region 67 of the npn-type transistor Q1, respectively, and a base terminal B1 is taken out from a p-type base region 68. Further, an emitter terminal E2 and a collector terminal C2 are taken out from a p-type emitter region 69 and a p-type collector region 70 of the L-pnp-type transistor Q2, respectively, and a base terminal B2 is taken out from an n-type base region (n-type well region) 71 of the L-pnp-type transistor Q2 through an n-type contact region 72. The semiconductor integrated circuit as described above is manufactured using steps of a Bi-CMOS (Bipolar-Complementary Metal Oxide Semiconductor) process.

In a semiconductor integrated circuit for the DC—DC converter according to the related art, at the time of switching by the driver constituting the CMOS inverter, the drain potential of the nMOS-type transistor is reduced to the ground potential or lower. The present inventor has recognized that there is a problem that a parasitic transistor is created between the nMOS-type transistor and other transistor integrated, being in close proximity to the nMOS-type transistor, so that the DC—DC converter malfunctions due to a parasitic current.

Figure 7A:
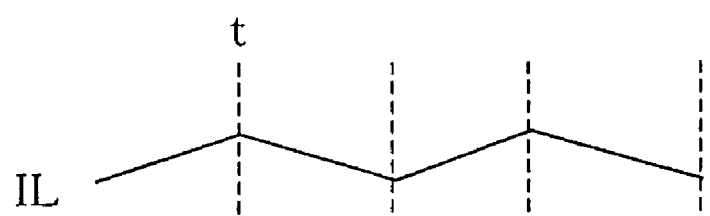
FIGS. 7A and 7B are diagrams showing signal waveforms during operation of the semiconductor integrated circuit for the DC—DC converter according to a related art.

More specifically, in the basic circuit configuration of the DC—DC converter in FIG. 5, at the time of switching by the driver 51 constituted from the CMOS inverter Ic, an output current IL as shown in FIG. 7A flows through the coil L, which is the inductive load on the driver 51, responsive to the output of the switching. Then, the output voltage of the driver 51 goes L (Low) at a timing t at which the pMOS-type transistor Qp of the CMOS inverter Ic is turned off and the nMOS-type transistor Qn of the CMOS inverter Ic is turned on. Thus, the output current IL is gradually decreased.

However, the output current IL does not become zero at the instant of the timing t due to the property of the coil L, and the output current IL therefore will continue to flow, as shown in FIG. 7A. Then, since a dead time Td for simultaneously switching off the nMOS-type transistor Qn and the pMOS-type transistor Qp is set through the timing adjustment circuit 58, the current is drawn (pulled) to the coil L from the ground (Gnd) potential.

Figure 7B:
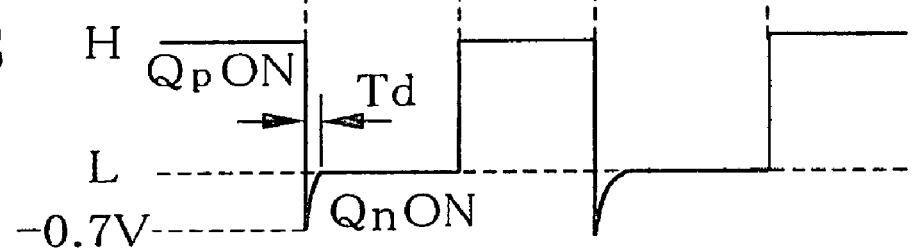

For this reason, as shown in FIG. 7B, during a period in which the pMOS-type transistor Qp is turned off from an on (an H(High) level) state and the nMOS-type transistor Qn is then turned on, the drain potential of the nMOS-type transistor Qn is decreased to approximately −0.7 V, which is less than the ground potential, without stopping at the ground potential.

Figure 8:
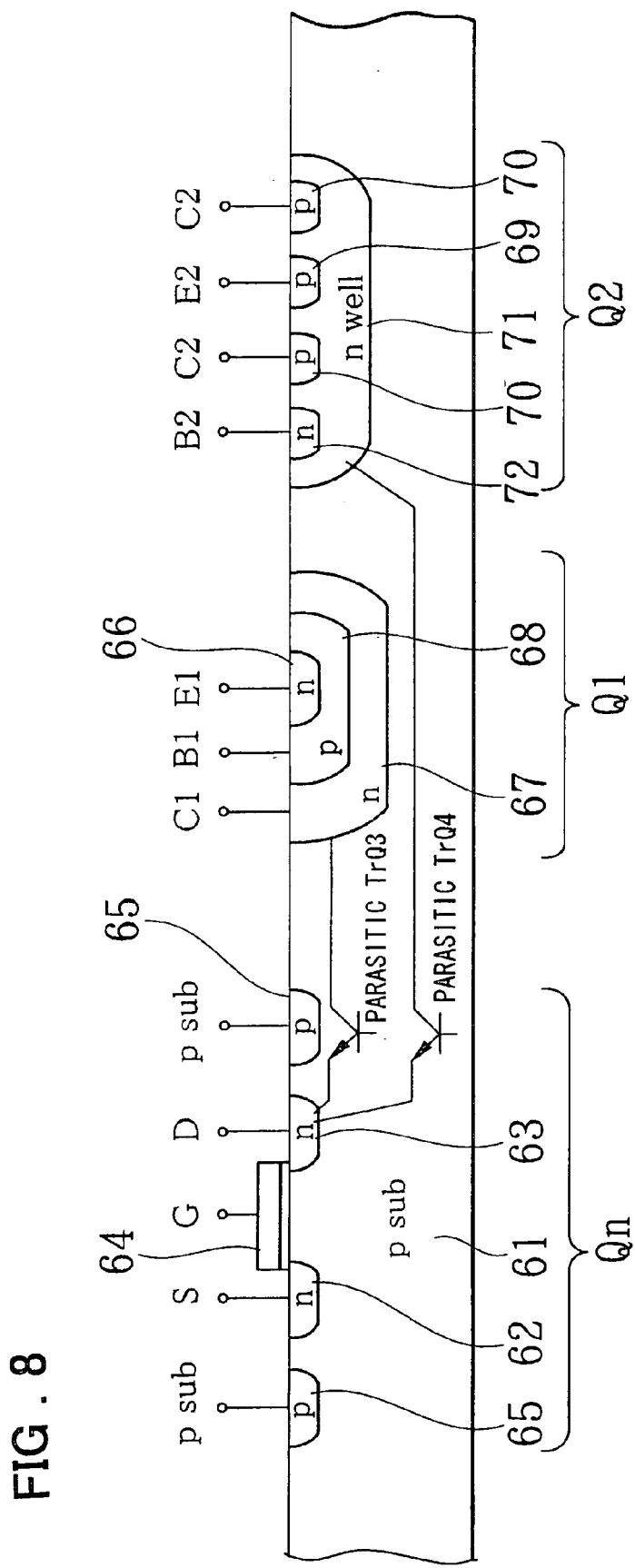
FIG. 8 is a sectional view showing a state, during operation, of the semiconductor integrated circuit for the DC—DC converter according to a related art.
Figure 9:
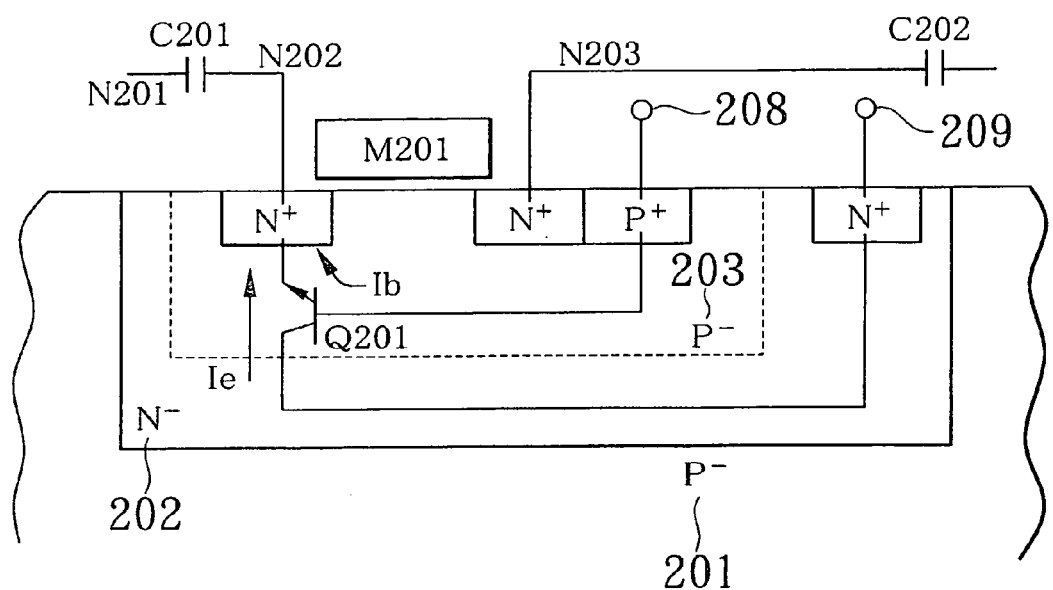
FIG. 9 is a sectional view showing an example of a conventional semiconductor integrated circuit for a negative step-up circuit.

As a result, as shown in FIG. 8, a parasitic npn-type transistor Q3 is created among the n-type drain region 63 of the nMOS-type transistor Qn, the n-type collector region 67 of the npn-type transistor Q1 in close proximity to this, and the substrate 61. Likewise, a parasitic npn-type transistor Q4 is created among the n-type drain region 63, the n-type base region 71 of the L-pnp-type transistor Q2, and the substrate 61; there arise flows of parasitic currents.

When the parasitic npn-type transistors Q3 and Q4 are created as described above, the currents that flow through the npn-type transistor Q1 and the L-pnp-type transistor Q2 will change due to the parasitic currents of Q3 and Q4. Thus, the DC—DC converter will malfunction. In order to prevent the malfunction described above, it is necessary to flow a large circuit current at a level that would not be subject to the influence of the parasitic currents, through the entire circuit. Due to this, lower power consumption and higher efficiency will become difficult. There also arises the need for giving consideration to the layout of components to be integrated so as to alleviate the influence of the parasitic currents. Thus, a constraint will be placed on latitude in layout design.

In the semiconductor integrated circuit described in Patent Document 1, consideration is not given to the malfunction caused by reduction of the drain potential of the NMOS-type transistor to the ground potential or lower at the time of switching by the driver constituted from the CMOS inverter, which is regarded as a problem in the present invention. Consideration is only given to the negative step-up circuit using the NMOS-type transistor of the triple-well structure.

A semiconductor integrated device according to the present invention is configured to switch a DC input voltage by a CMOS inverter therein, for outputting to an inductive load therein, and generate a control voltage responsive to an output voltage by a feedback control system therein, the control voltage being fed back to the CMOS inverter, wherein the switching is repeated so as to finally obtain a desired DC output voltage. The device is configured to include transistors constituting the CMOS inverter and other transistors constituting the feedback control system, the transistors and the other transistors being integrated on a same semiconductor substrate therein. In the device, an nMOS-type transistor constituting one of the transistors constituting the CMOS inverter is formed on the semiconductor substrate through a semiconductor region electrically insulated from the other transistors constituting the feedback control system.

[Embodiments]

Figure 1:
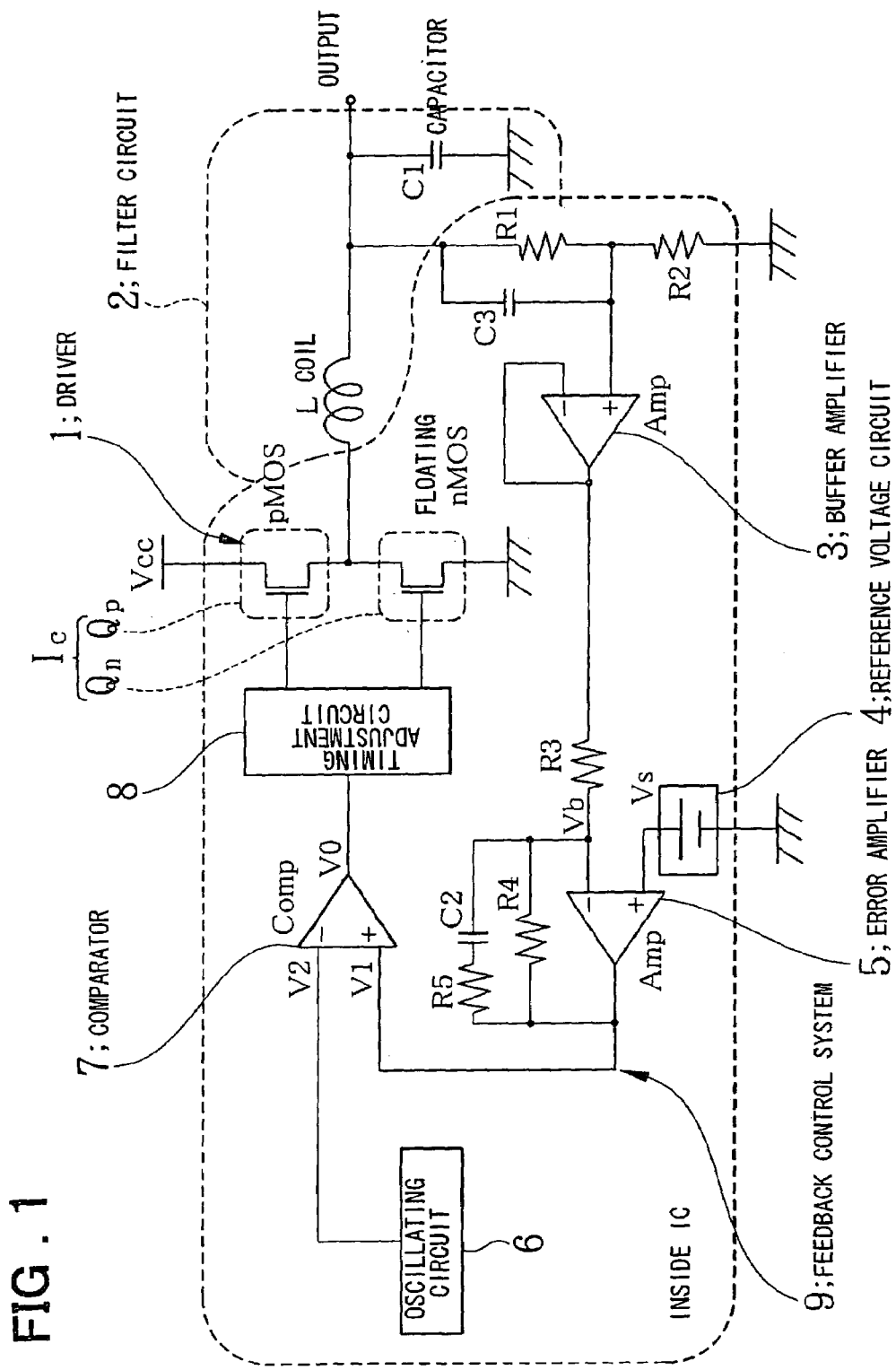
FIG. 1 is a diagram showing a basic circuit configuration of a semiconductor integrated device for a DC—DC converter according to an embodiment of the present invention.
Figure 2:
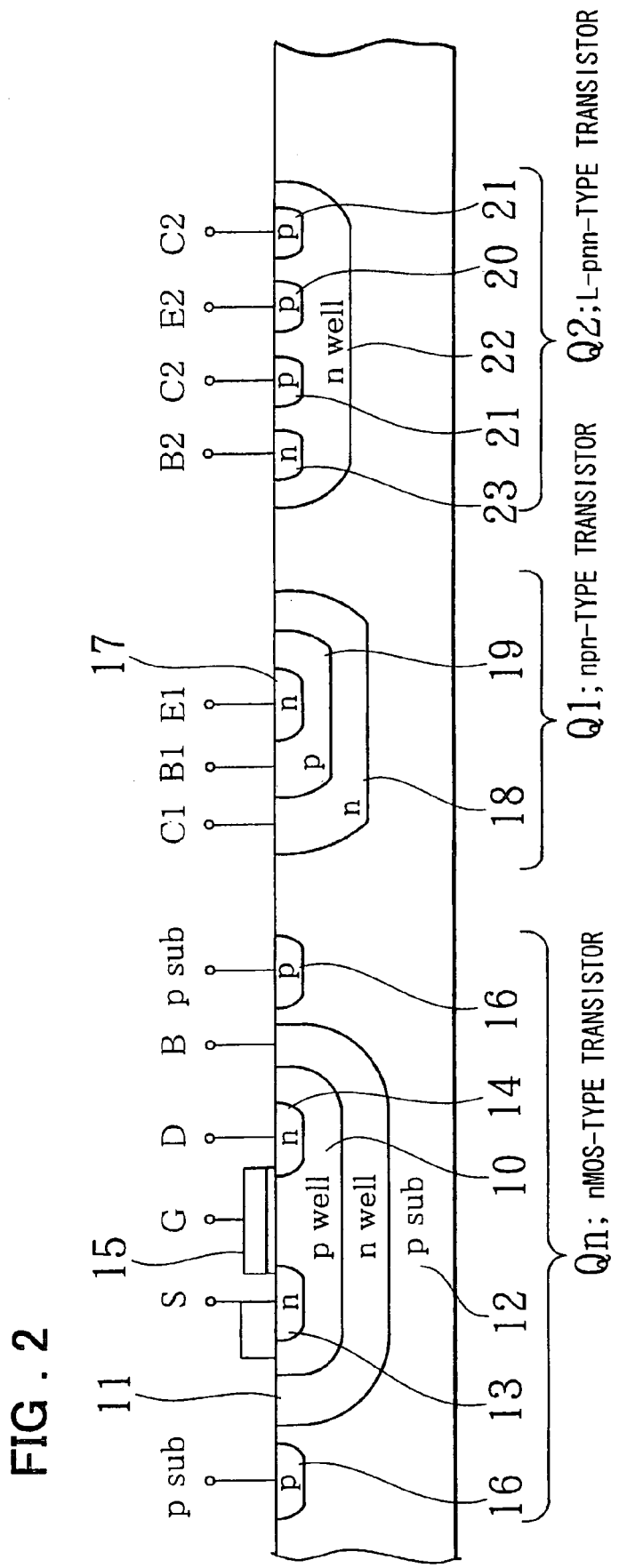
FIG. 2 is a sectional view showing a part of the semiconductor integrated circuit for the DC—DC converter.
Figure 3A:
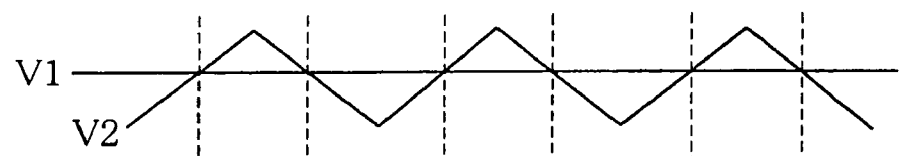
FIGS. 3A, 3B, 3C and 3D are diagrams showing signal waveforms during operation of the semiconductor integrated circuit for the DC—DC converter of the basic circuit configuration.
Figure 3B:
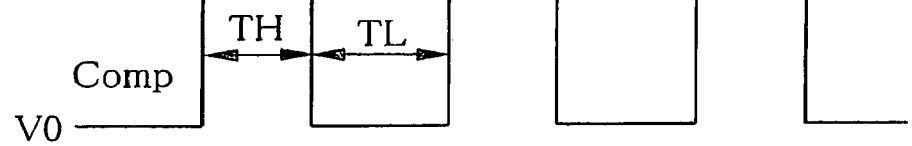
Figure 3C:
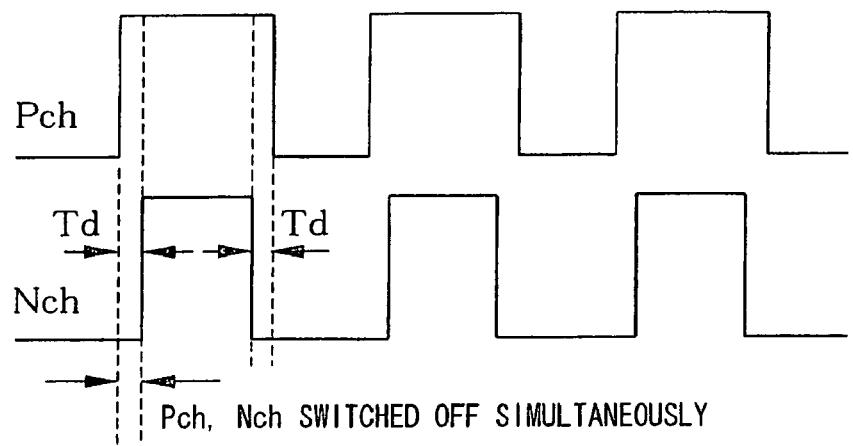
Figure 3D:
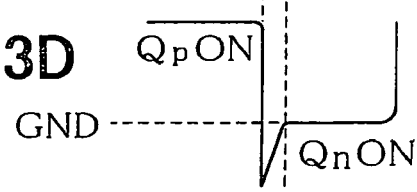
Figure 4:
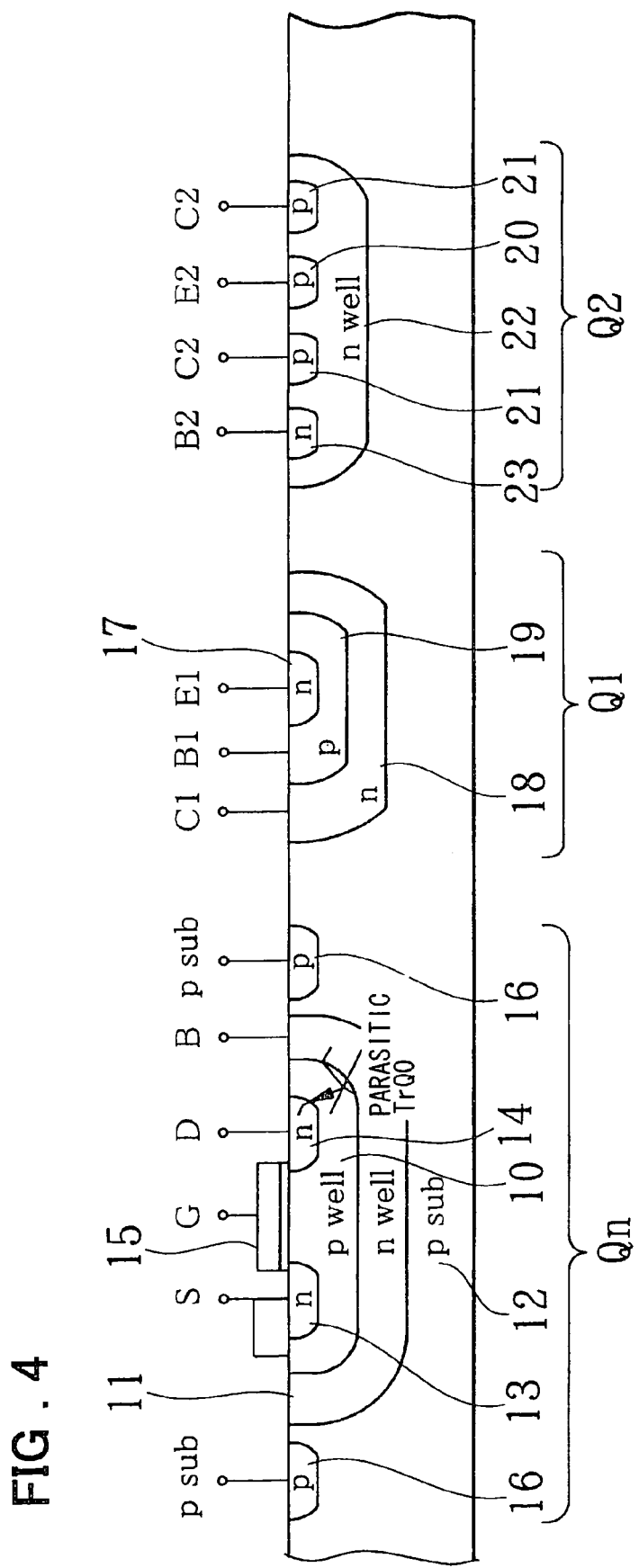
FIG. 4 is a diagram showing a state, during operation, of the semiconductor integrated circuit for the DC—DC converter.

FIG. 1 is a diagram showing a basic circuit configuration of a semiconductor integrated circuit for a DC—DC converter according to an embodiment of the present invention. FIG. 2 is a sectional view showing a part of the semiconductor integrated circuit for the DC—DC converter, FIGS. 3A, 3B, 3C and 3D are diagrams showing signal waveforms during operation of the DC—DC converter of the basic circuit configuration, and FIG. 4 is a sectional view showing a state, during operation, of the semiconductor integrated circuit for the DC—DC converter.

As shown in FIG. 1, a basic circuit configuration of the semiconductor integrated circuit for the DC—DC converter in this embodiment comprises a driver (driver circuit) 1, a filter circuit 2, a buffer amplifier 3, an error amplifier 5, a comparator 7, and a timing adjustment circuit 8. The driver 1 is formed of a CMOS inverter Ic for switching a power supply voltage (DC input voltage) Vcc, for output. The filter circuit 2 smoothes the output of the driver 1 and outputs a preset desired DC voltage (set DC voltage). The buffer amplifier 3 receives the output of the filter circuit 2. The error amplifier 5 receives an output Vs of a reference voltage circuit 4 formed of a regulator or the like and an output Vb of the buffer amplifier 3, and amplifies a difference voltage between the both outputs Vs and Vb. The comparator 7 receives, as inputs, the output of the error amplifier 5 and the output of an oscillating circuit 6. The output of the comparator 7 is supplied to the timing adjustment circuit 8, and the outputs of the timing adjustment circuit 8 are connected to the gates of the driver 1. A reference character Qn denotes an nMOS-type transistor constituting one of the CMOS inverter Ic, Qp denotes a pMOS-type transistor constituting the other of the CMOS inverter Ic, R1 to R5 denote resistances, C1 to C3 denote capacitors, L denotes a coil that acts as an inductive load, Vs denotes the output voltage of the reference voltage circuit 4, and Vb denotes the output voltage of the buffer amplifier 3.

The resistances R1 to R5, capacitors C2 and C3, buffer amplifier 3, reference voltage circuit 4, error amplifier 5, oscillating circuit 6, comparator 7, and timing adjustment circuit 8 make up a feedback control system 9. This feedback control system 9 is so configured that the feedback control system inputs the output voltage of the filter circuit 2, and generates a control pulse (a control voltage) in accordance with a difference voltage between this output voltage and a set DC voltage, and the control pulse is input to the gates of the CMOS inverter Ic constituting the driver 1 through the timing adjustment circuit 8 to control the switching operation of the driver 1, thereby finally outputting the desired set DC voltage as the DC—DC converter. The timing adjustment circuit 8 constitutes the final stage of the feedback control system 9 and sets a dead time Td for switching off the nMOS-type transistor Qn and the pMOS-type transistor Qp simultaneously so as to prevent a through current from passing through the CMOS inverter Ic due to simultaneous switching on of the nMOS-type and pMOS-type transistors at the time of switching of the driver 1 constituted from the CMOS inverter Ic.

As shown in FIG. 2, in the semiconductor device for the DC—DC converter in this embodiment, an n-type well region 11 is formed on a p-type semiconductor substrate 12, a p-type well region 10 is formed on the n-type well region 11, and an nMOS-type transistor Qn constituting one of the CMOS inverter Ic as the driver 1 is formed on the p-type well region 10 through the n-type well region 11. Further, on locations of the substrate 12, being in close proximity to the nMOS-type transistor Qn, other transistors such as an npn-type transistor Q1 and an L-pnp-type transistor Q2 constituting the feedback control system 9 are formed. Due to this configuration, the nMOS-type transistor Qn is present, being electrically floated from the substrate 12 through the n-type well region 11, and is electrically insulated from the other transistors such as the npn-type transistor Q1 and the L-pnp-type transistor Q2 formed on other locations of the substrate 12 by means of the n-type well region 11.

A source terminal S and a drain terminal D are taken out from an n-type source region 13 and an n-type drain region 14 of the nMOS-type transistor Qn, respectively, a gate terminal G is taken out from an insulating gate section 15, and a substrate terminal p sub is taken out from a substrate 12 through a p-type contact region 16. Further, an emitter terminal E1 and a collector terminal C1 are taken out from an n-type emitter region 17 and an n-type collector region 18 of the npn-type transistor Q1, respectively, and a base terminal B1 is taken out from a p-type base region 19 of the npn-type transistor Q1. Further, from a p-type emitter region 20 and a p-type collector region 21 of the L-pnp-type transistor Q2, an emitter terminal E2 and a collector terminal C2 are taken out, respectively, and from an n-type base region (n-type well region) 22 of the L-pnp-type transistor Q2, a base terminal B2 is taken out via an n-type contact region 23. The semiconductor integrated circuit for the DC—DC converter as described above is manufactured using Bi-CMOS process steps, which will be described later.

Next, an operation of the DC—DC converter in FIG. 1 that is used in the semiconductor integrated circuit for the DC—DC converter in this embodiment will be described.

A description is directed to a case where a power supply voltage Vcc is set to 3.0 to 4.2V, this Vcc is switched by the driver 1 formed of the CMOS inverter Ic, and finally a desired set DC voltage of 1.5V is output. A DC voltage output from the filter circuit 2 including the inductive load formed of the coil L and the capacitor C1 is resistive voltage divided by the resistances R1 and R2, and a voltage across both ends of the resistance R2 (i.e. a voltage at the node between R1 and R2) is input to the buffer amplifier 3 in the feedback control system 9. The output voltage Vb of the buffer amplifier 3 is input to the error amplifier 5 (at an inverted terminal −) together with the reference voltage Vs (at an noninverted terminal +) from the reference voltage circuit 4. The error amplifier 5 amplifies a difference voltage between the output Vb and the output Vs, and outputs an output voltage V1 as shown in FIG. 3A to one input terminal of the comparator 7. To the other input terminal of the comparator 7, a high-frequency voltage V2 of 0.5 to 1.0V with 1 MHz frequency, having a saw-like waveform, as shown in FIG. 3A, for example, is output from the oscillating circuit 6. The comparator 7 compares the output V1 with the output V2, and outputs a rectangular wave voltage Vo as shown in FIG. 3B to the timing adjustment circuit 8 as a control pulse. The timing adjustment circuit 8 applies control pulses as shown in FIG. 3C to the respective gates of the pMOS-type transistor Qp and the nMOS-type transistor Qn. More specifically, the timing adjustment circuit 8 inputs the control pulses with dead times Td set therein to the gates of the driver 1. The dead times Td are the times for simultaneously switching off the pMOS-type transistor Qp and the nMOS-type transistor Qn. Then, based on these control pulses, the driver 1 switches Vcc, thereby outputting a voltage having a waveform as shown in FIG. 3D to the filter circuit 2. Then, the filter circuit 2 smoothes the voltage and outputs the DC voltage.

When the DC voltage output from the filter circuit 2 is deviated (by a difference ΔV) from 1.5V, which is the desired voltage, in the feedback operation by the feedback control system 9 as described above, the voltage input to the comparator 7 from the error amplifier 5 based on the DC voltage input through the buffer amplifier 3 changes according to the difference voltage (i.e. VI varies in accordance with ΔV). Thus, the output waveform of the comparator 7 changes the duty ratio of the pulse according to its difference voltage. That is, the comparator 7 outputs a control pulse with an output high level time TH thereof being changed depending on ΔV. When the DC voltage output from the filter circuit 2 exceeds 1.5V described above, for example, the comparator 7 outputs a control pulse with a reduced high level time TH so that the DC voltage output from the filter circuit 2 is reduced to 1.5V, which is the set DC voltage. On the other hand, when the DC voltage output from the filter circuit 2 is below 1.5V described above, the comparator 7 outputs a control pulse with a prolonged high level time TH so that the DC voltage output from the filter circuit 2 is increased to 1.5V, which is the set DC voltage. As a result, by switching the driver 1 constituted from the CMOS inverter Ic by the timing adjustment circuit 8 according to the control pulses, the duty ratio of the output pulse of the driver 1 is changed. By causing a series of feedback control to be performed as described above, the DC voltage output from the filter circuit 2 is controlled to be finally converged to 1.5V in both of the cases in which the DC voltage exceeds 1.5V and the DC voltage is below 1.5V, which is the desired voltage.

In the operation of the DC—DC converter as described above, even if the drain potential of the nMOS-type transistor Qn is reduced to approximately −0.7 V below the ground voltage or a voltage at which the parasitic transistor is operated during a dead time Td spanning from turning off the pMOS-type transistor Qp to the tuning on of the nMOS-type transistor Qn at the time of switching by the driver 1 constituted from the CMOS inverter Ic in the basic circuit configuration in FIG. 1, the nMOS-type transistor Qn is electrically floated from the substrate 12 by the n-type well region 11. Thus, the nMOS-type transistor Qn is electrically insulated from the other transistors, such as the npn-type transistor Q1 and the L-pnp-type transistor Q2, those making up the feedback control system 9 through the n-type well region 11. Accordingly, though a parasitic npn-type transistor Q0 is formed due to the n-type drain region 14, the p-type well region 10, and the n-type well region 11 of the nMOS-type transistor Qn, as shown in FIG. 4, parasitic npn-type transistors Q3 and Q4 as in the example of the prior art shown in FIG. 8 are not created. Incidentally, in this case, it is preferable that the n-type well region 11 is connected to a constant potential such as the highest power supply potential Vcc so as to be electrically held to be stable. The potential for the connection is not limited to the power supply potential, and a connection to the ground voltage is also effective.

As a result, only the parasitic current caused by the parasitic npn-type transistor Q0 flows, and there are no parasitic current flows between the nMOS transistor Qn and the other transistors in the feedback control system 9 as in the example of the prior art. Thus, the currents that flow through the npn-type transistor Q1 and the L-pnp-type transistor Q2 will not change, thereby preventing the DC—DC converter from malfunctioning. Further, due to reduction of the parasitic current, the need for causing a large circuit current to be flown through the entire circuit so as not to be influenced by the parasitic currents as in the prior art is eliminated. Thus, lower power consumption and higher efficiency are facilitated. According to this example, the circuit current could be reduced to $\frac{1}{5}$ to $\frac{1}{10}$, compared with the example of the prior art. Further, according to this example, the influence of the parasitic current is suppressed. The need for giving consideration to layout of the components for integration is thereby significantly eliminated. Latitude in layout design thus can be enlarged.

Next, the advantage of the manufacturing method of the semiconductor integrated circuit for the DC—DC converter in this example will be described.

In the Bi-CMOS process, the n-type well region 11 for causing the nMOS-type transistor Qn to be floated from the substrate 12 can be formed by the same process steps as with the n-type collector region 18 for the npn-type transistor Q1 and the n-type well region 22 for the L-pnp-type transistor Q2, using a known ion implantation method. Accordingly, there is no need for adding an extra step. Thus, a cost increase will not be accompanied.

As described above, according to the semiconductor integrated circuit for the DC—DC converter in this example, the nMOS-type transistor Qn of the CMOS inverter Ic constituting the driver 1 is electrically floated from the substrate 12 by the n-type well region 11. Thus, the nMOS-type transistor Qn is electrically insulated from other transistors such as the npn-type transistor Q1 and the L-pnp-type transistor Q2 constituting the feedback control system 9 through the n-type well region 11. Thus, no parasitic transistors will be created between the nMOS-type transistor Qn and other transistor configuring regions.

Accordingly, even if the drain potential of the nMOS-type transistor is decreased to the ground potential or lower at the time of switching by the driver constituted from the CMOS inverter, no malfunction due to the influence of the parasitic current will occur. A stable operation can be performed with a minute current, lower power consumption and higher efficiency are facilitated, and a restriction on the layout design of the components can be eliminated.

As described above, the embodiment of the present invention was described with reference to the drawings. A specific configuration is not limited to this embodiment, and even if a change in the design or the like that would not depart from the gist of the present invention may be made, this change is included in the present invention. In the description of the operation of the DC—DC converter constituting the semiconductor integrated circuit for the DC—DC converter, for example, the voltage values such as the power supply voltage Vcc and the desired output voltage show one example, and these voltage values can be changed arbitrarily, according to the application, object and the like. Further, in the embodiment, the description was given, using the semiconductor integrated circuit for the DC—DC converter of the step-down type as an example. Though the problem such as seen in the step-down type is basically not liable to be generated in the step-up type, the present invention is not always limited to the step-down type, and can also be applied to the step-up type.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit for a DC—DC converter comprising:
   a CMOS inverter configured to switch a DC input voltage, for providing an output to an inductive load therein, and
   a feedback control system for generating a control voltage responsive to an output voltage to be fed back to said CMOS inverter,
   repeating the switching so as to finally obtain a desired DC output voltage,
   said semiconductor integrated circuit comprising transistors constituting said CMOS inverter and other transistors constituting said feedback control system, said transistors and said other transistors being integrated on a same semiconductor substrate therein, wherein
   an nMOS-type transistor which is one of said transistors constituting said CMOS inverter is formed on said semiconductor substrate through a semiconductor region electrically insulated from said other transistors constituting said feedback control system.

2. The semiconductor integrated circuit for the DC—DC converter according to claim 1, wherein said semiconductor region is an n-type well region.

3. The semiconductor integrated circuit for the DC—DC converter according to claim 2, wherein said n-type well region is formed by same process steps as a region constituting at least one of said other transistors.

4. The semiconductor integrated circuit for the DC—DC converter according to claim 2, wherein said n-type well region is connected to a stable potential.

5. The semiconductor integrated circuit according to claim 4, wherein the stable potential is a power supply potential or a ground potential.

6. The semiconductor integrated circuit for the DC—DC converter according to claim 1, wherein a timing adjustment circuit for constituting a final stage of said feedback control system and preventing a through current from flowing through said CMOS inverter is connected to said CMOS inverter.

7. The semiconductor integrated circuit for the DC—DC converter according to claim 6, wherein said timing adjustment circuit sets a time for simultaneously switching off said nMOS-type transistor and a pMOS-type transistor constituting said CMOS inverter.

8. The semiconductor integrated circuit for the DC—DC converter according to claim 1, wherein said DC—DC converter comprises a step-down type converter.

* * * * *